(12) United States Patent
Mancini et al.

(10) Patent No.: US 6,890,688 B2
(45) Date of Patent: May 10, 2005

(54) LITHOGRAPHIC TEMPLATE AND METHOD OF FORMATION AND USE

(75) Inventors: David P. Mancini, Fountain Hills, AZ (US); Douglas J. Resnick, Phoenix, AZ (US); Carlton Grant Willson, Austin, TX (US)

(73) Assignees: Freescale Semiconductor, Inc., Austin, TX (US); University of Texas System, Austin, TX (US)

( * ) Notice: Subject to any disclaimer, the term of this patent is extended or adjusted under 35 U.S.C. 154(b) by 50 days.

(21) Appl. No.: 10/022,489

(22) Filed: Dec. 18, 2001

(65) Prior Publication Data

US 2003/0113638 A1 Jun. 19, 2003

(51) Int. Cl.[7] .................................................. G03C 5/00
(52) U.S. Cl. .......................... 430/5; 430/302; 430/309; 430/310; 430/311; 430/313; 430/527; 101/450.1; 101/456; 101/463.1; 216/44
(58) Field of Search ............................ 430/5, 302, 309, 430/310, 311, 313, 527; 101/450.1, 456, 463.1; 216/44

(56) References Cited

U.S. PATENT DOCUMENTS

| 5,772,905 A | | 6/1998 | Chou | |
|---|---|---|---|---|
| 5,792,411 A | | 8/1998 | Morris et al. | |
| 6,387,787 B1 | * | 5/2002 | Mancini et al. | 438/586 |
| 6,517,977 B2 | * | 2/2003 | Resnick et al. | 430/5 |

FOREIGN PATENT DOCUMENTS

| DE | 4140712 A1 | 10/1992 |
|---|---|---|
| DE | 0614123 A1 | 9/1994 |

OTHER PUBLICATIONS

Horigome et al., "Novel stamper process for optical disc," SPIE vol. 899 Optical Storage Technology and Applications (1988), pp. 123–128.

Hollingsworth et al., "Resistless patterning of hydrogenated amorphous silicon films," Mat. Res. Soc. Symp. Proc. vol. 557, 1999 Materials Research Society, pp. 821–826.

Wei et al., "Direct patterning ITO transparent conductive coatings," Solar Energy Materials & Solar Cells 68 (2001), pp. 383–390.

\* cited by examiner

*Primary Examiner*—Christopher G. Young

(57) ABSTRACT

This invention relates to a lithographic template, a method of forming the lithographic template and a method for forming devices with the lithographic template. The lithographic template (10, 110, 210) is formed having a substrate (12, 112, 212) and a charge dissipation layer (20, 120, 220), and a patterned imageable relief layer, (16, 116, 216) formed on a surface (14, 114, 214) of the substrate (10, 110, 210) using radiation. The template (10, 110, 210) is used in the fabrication of a semiconductor device (344) for affecting a pattern in the device (344) by positioning (338) the template (10, 11, 210) in close proximity to semiconductor device (344) having a radiation sensitive material (334) formed thereon and applying a pressure (340) to cause the radiation sensitive material to flow into the relief image present on the template (10, 110, 210). Radiation (342) is then applied through the template (10, 110, 210) to cure portions of the radiation sensitive material and define the pattern in the radiation sensitive material. The template (10, 110, 210) is then removed to complete fabrication of semiconductor device (344).

37 Claims, 3 Drawing Sheets

LITHOGRAPHIC TEMPLATE AND METHOD OF FORMATION AND USE

FIELD OF THE INVENTION

The present invention relates to semiconductor devices, microelectronic devices, micro-electro mechanical devices, photonic, optoelectronic, and microfluidic devices, and more particularly to a lithographic template, a method of forming the lithographic template and a method for forming these devices with the lithographic template.

BACKGROUND OF THE INVENTION

The fabrication of integrated circuits involves the creation of several layers of materials that interact in some fashion. One or more of these layers may be patterned so various regions of the layer have different electrical characteristics, which may be interconnected within the layer or to other layers to create electrical components and circuits. These regions may be created by selectively introducing or removing various materials. The patterns that define such regions are often created by lithographic processes. For example, a layer of photoresist material is applied onto a layer overlying a wafer substrate. A photomask (containing clear and opaque areas) is used to selectively expose this photoresist material by a form of radiation, such as ultraviolet light, electrons, or x-rays. Either the photoresist material exposed to the radiation, or that not exposed to the radiation, is removed by the application of a developer. An etch may then be applied to the layer not protected by the remaining resist, and when the resist is removed, the layer overlying the substrate is patterned.

Lithographic processes such as that described above are typically used to transfer patterns from a photomask to a device. As feature sizes on semiconductor devices decrease into the submicron range, there is a need for new lithographic processes, or techniques, to pattern high-density semiconductor devices. Several new lithographic techniques which accomplish this need and have a basis in imprinting and stamping have been proposed. One in particular, Step and Flash Imprint Lithography (SFIL), has been shown to be capable of patterning lines as small as 60 nm.

Overall, SFIL techniques benefit from their unique use of photochemistry, ambient temperature processing, and the low contact pressure required to carry out the SFIL process. During a typical SFIL process, a substrate is coated with an organic planarization layer, and brought into close proximity of a transparent SFIL template, typically comprised of quartz, containing a relief image and coated with a low surface energy material. An ultraviolet or deep ultraviolet sensitive photocurable organic solution is deposited between the template and the coated substrate. Using minimal pressure, the template is brought into contact with the substrate, and more particularly the photocurable organic layer. Next, the organic layer is cured, or exposed, at room temperature by photoillumination through the template. The light source typically uses ultraviolet radiation. A range of wavelengths (150 nm–500 nm) is possible, depending upon the transmissive properties of the template and photosensitivity of the photocurable organic. The template is next separated from the substrate and the organic layer, leaving behind an organic replica of the template relief on the planarization layer. This pattern is then etched with a short halogen break-through, followed by an oxygen reactive ion etch (RIE) through the planarization layer to form a high-resolution, high aspect-ratio feature in the organic layer and planarization layer.

The distinction between a lithographic mask and a lithographic template should be noted. A lithographic mask is used as a stencil to impart an aerial image of light into a photoresist material. A lithographic template has a relief image formed into its surface, creating a form or mold. During SFIL, a pattern is defined when a photocurable liquid flows into the relief image and is subsequently cured. During standard imprint lithography, a pattern is defined when a material present on the surface of a substrate material deforms in response to pressure exerted thereupon by a patterned template. The attributes necessary for masks and templates, therefore are quite different.

One process of fabricating SFIL templates includes applying a layer of chrome, 80–100 nm thick, onto a transparent quartz plate. A resist layer is applied to the chrome and patterned using either an electron beam or optical exposure system. The resist is then placed in a developer to form patterns on the chrome layer. The resist is used as a mask to etch the chrome layer. The chrome then serves as a hard mask for the etching of the quartz plate. Finally, the chrome is removed, thereby forming a quartz template containing relief images in the quartz.

SFIL technology has been demonstrated to resolve features as small as 60 nm. As such, a wide variety of feature sizes may be drawn on a single wafer. Certain problems exist though with this SFIL template fabrication methodology. In particular, problems exist with the conventional resist, masking and etch process. More particularly, problems exist with respect to the number of required steps needed to fabricate the template, namely, the etching of the chrome, the etching of the quartz material, and the required etch and resist removal steps. It should be understood that each etching step increases the probability of defects and changes in feature dimension.

In addition, there exist problems with respect to electron-beam writing of the template and the inspection of the template subsequent to fabrication. In particular, a charge dissipation layer must be present, in order to avoid charge build-up during electron-beam exposure. In addition, inspectability is not readily achievable due to the template being comprised of a single material. Typical inspection systems use either light (ultraviolet or deep ultraviolet) or electrons to determine feature size and detect unwanted defects on the template. Light-based systems require a difference in reflection or index of refraction between patterned and unpatterned areas of the template to provide good image contrast. Likewise, an electron-based system requires a difference in atomic number between patterned and unpatterned areas of the template. To overcome this problem, a template comprised of multiple materials having either different optical properties, electron scattering properties, or different atomic numbers would allow for inspection, a necessity for sub-100 nm features.

Accordingly, there is a need to simplify the fabrication process of forming SFIL templates. Specifically, it would be beneficial to provide for a template in which fewer processing steps are required to fabricate a template for use in SFIL technology and a template in which inspection for sub-micron structures is achievable.

It is a purpose of the present invention to provide for an improved lithographic template, a method of fabricating the improved lithographic template, and a method for making semiconductor devices with the improved lithographic template in which minimal fabrication steps are utilized thus providing for fewer defects.

It is a purpose of the present invention to provide for an improved lithographic template, a method of fabricating the improved lithographic template, and a method for making semiconductor devices with the improved lithographic template in which standard resist, masking and etching steps are eliminated.

It is another purpose of the present invention to provide for an improved lithographic template, a method of fabricating the improved lithographic template, and a method for making semiconductor device with the improved lithographic template in which improved control of relief (critical dimensions) size formed on the template is obtainable.

It is yet another purpose of the present invention to provide for an improved lithographic template, a method of fabricating the improved lithographic template, and a method for making semiconductor devices with the improved lithographic template in which improvement in the inspection of sub-micron structures is achieved.

It is still another purpose of the present invention to provide for an improved lithographic template, a method of fabricating the improved lithographic template, and a method for making semiconductor devices with the improved lithographic template in which improvement in the template and fabrication process provides for higher throughput and cost effectiveness.

SUMMARY OF THE INVENTION

This invention relates to semiconductor devices, microelectronic devices, micro electro mechanical devices, optoelectronic devices, photonic devices, microfluidic devices, and more particularly to a lithographic template, a method of forming the lithographic template, and a method for making semiconductor devices with the improved lithographic template. Disclosed is a lithographic template and a method of fabricating the template including a planar material which is able to form a relief image by direct patterning. The template is formed by providing a substrate, the substrate having an uppermost surface, and forming a patterned relief layer supported by the substrate. Additionally, disclosed is a method for making a device with the lithographic template as provided, including the steps of providing a substrate, coating the substrate with a deformable material, providing a lithographic template as previously disclosed, positioning the lithographic template in contact with the deformable material, applying pressure to the template so that a pattern is created in the deformable material, optically transmitting radiation through the lithographic template to expose at least a portion of the deformable material on the substrate, thereby further affecting the pattern in the deformable material, and removing the template from the substrate.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

It will be appreciated that for simplicity and clarity of illustration, elements illustrated in the drawings have not necessarily been drawn to scale. For example, the dimensions of some of the elements are exaggerated relative to other elements for purposes of clarity. Furthermore, where considered appropriate, reference numerals have been repeated among the drawings to indicate corresponding or analogous elements.

DESCRIPTION OF THE PREFERRED EMBODIMENTS

The present invention relates to the improvement of a template that will be able to utilize known photomask handling equipment, such as cleaning and inspection equipment, yet still allow for a template appropriate for use in standard imprint lithography as well as SFIL for producing patterns in semiconductor devices. Since in the course of fabricating a template, a patterned relief layer must be formed, it is necessary to make a distinction between the various methods of forming this layer. In general, in conventional template patterning, any layer which is to be patterned is first deposited uniformly on a substrate by some means such as spin coating or deposition from a vapor phase. A layer of an imageable material (resist), typically a photon or e-beam sensitive polymer is next applied to this surface and patterned using optical or e-beam methods which are well know in the art of lithography. A pattern is formed following a development process which preferentially removes material from the resist layer forming a pattern. The resist layer is used as a mask to transfer its pattern to the layer underneath via etching using wet or dry methods. Finally, the resist layer is removed as it is no longer needed, with the pattern now residing in the template's uppermost relief layer.

This conventional template patterning methodology is distinctly different from the current invention. Conventional indirect patterning involves the use of a radiation sensitive photoresist material that is used as a masking layer to apply a defined removal of an underlying layer using an etch process. Here, in the indirect case, a photoresist material acts as an intermediate masking layer, and is useful only for its patterning and masking qualities, but is not useful as a final relief layer. The conventional photoresist, not having the mechanical properties to be useful as a relief layer, is removed once the pattern formed in it has been transferred to the underlying layer. In this manner, any appropriate material that is etchable can be used as the underlayer, being transformed into the relief layer by means of this resist masking, etch and resist removal process. In contrast, disclosed herein is the use of direct patterning which includes a resist, or patterning, layer that once patterned is not used as an intermediate layer to effect pattern transfer to a second layer. Rather the patterning layer, which is itself radiation sensitive, actually becomes the final template relief structure subsequent to patterning by irradiation and development. This is made possible by judicious use of unique materials which combine the patternable characteristics of a photoresist, with the robust mechanical properties required of a template relief layer. These properties include high adhesive strength to the substrate, high modulus, high shear strength, and good thermal stability. Materials such as hydrogen silsesquioxane (HSQ) are patternable to a very high resolution and, once cured, form a very stable silicon oxide suitable as a template relief structure for imprinting. Materials with similar characteristics may be substituted for this application for HSQ. However, it should be noted that any such materials which are both irradiation sensitive and patternable, and possess adequate physical properties to behave as a template relief layer are unique and are the heart of this invention.

Referring to FIGS. 1–13, illustrated in cross-sectional views, are a plurality of process steps for fabricating a lithographic template according to the preferred embodiments of the present invention. Referring more specifically to FIGS. 1–4, illustrated are the steps in the process of fabricating a first embodiment of the lithographic template according to the present invention.

Figure 1:
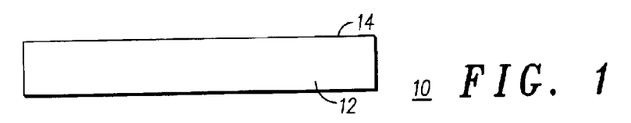
FIGS. 1–13 illustrate in cross-section views, process steps for fabricating a lithographic template in accordance with the embodiments of the present invention.

Referring now to FIG. 1, illustrated is a first step in the process of fabricating a lithographic template 10 according to the present invention. Illustrated is substrate 12, having a surface 14. Substrate 12 is disclosed as being comprised of a transparent or semi-transparent material, such as a quartz material, a polycarbonate material, a pyrex material, a calcium fluoride ($CaF_2$) material, a magnesium fluoride material ($MgF_2$), or any other similar type of material, that is transparent or semi-transparent to light.

Figure 2:
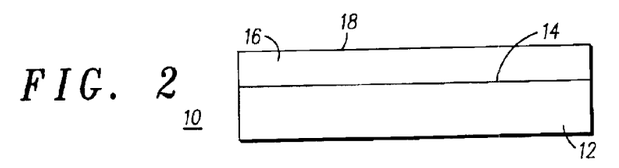

Referring now to FIG. 2, illustrated is substrate 12, having deposited thereon uppermost surface 14 a patterning layer 16. Patterning layer 16 is disclosed as generally having a thickness dependent upon the desired aspect ratio of the resulting patterning. Specifically, patterning layer 16 will need to have sufficient mechanical strength and durability to survive the stresses associated with template manufacturing and subsequent handling during the fabrication of the semiconductor devices with the completed lithographic template. Patterning layer 16 is therefore generally disclosed as having a thickness of between 10 and 5000 nm, and a preferred thickness of at least 50 nm. Patterning layer 16, having a surface 18, is formed on surface 14 of substrate 12 by spin coating, sputtering, vapor deposition, or the like.

Patterning layer 16 in a preferred embodiment is disclosed as being formed of an imageable dielectric material. More specifically, patterning layer is disclosed as being formed of an imageable oxide, such as hydrogen silsesquioxane (HSQ), marketed by Dow Corning as FOX-15®. In addition, patterning layer 16 could be formed of alternative imageable dielectric materials, such as an imageable nitride, or an imageable oxynitride. During template fabrication, patterning layer 16 is formed on surface 14 of substrate 12 and then baked at a low temperature, such as approximately 200° C., to remove any solvents present.

Figure 3:
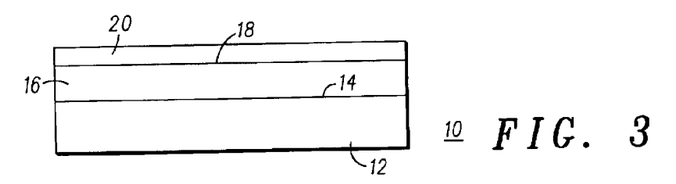

Referring now to FIG. 3, illustrated is substrate 12, having formed thereon patterning layer 16. Next, a charge dissipation layer 20 is formed on surface 18 of patterning layer 16. Charge dissipation layer 20 is disclosed as being formed of a conductive material characterized as dissipating the charge during template fabrication. More specifically, charge dissipation layer 20 is disclosed as being formed of a conductor such as aluminum (Al), copper (Cu), titanium (Ti), polyanaline, or any other conductive material that is selectively removable from the patterning layer and acts to dissipate charge. Charge dissipation layer 20 is formed to assist in the dissipation of charge during electron beam (e-beam) writing, or other radiation forms used to pattern the layers (discussed presently).

Charge dissipation layer 20 is disclosed as having a minimal thickness dependent upon the charge conductivity of the material used. Charge dissipation layer 20 is therefore generally disclosed as having a thickness in a range of 1–1000 nm, and a preferred thickness of at least 5 nm. Charge dissipation layer 20 is formed on surface 18 of patterning layer 16 by spin coating, sputtering, vapor deposition, or the like. In this particular embodiment charge dissipation layer 20 is formed of aluminum (Al) which is deposited on patterning layer 16.

It is anticipated by this disclosure that other materials may be coated on top of patterning layer 16 and used as a means of charge dissipation whenever this is necessary such as with e-beam lithography. These materials must be conductive, and must also be very thin so as not to degrade resolution by interfering with the irradiation source. Since it may be desirable to later remove this conducting layer, for processing convenience, a criterion for choosing a conduction layer is ease of removal. Removal of this layer can be done using either wet or dry etch techniques. However, to maintain the high resolution of the resultant patterned relief layer, removal must be done in a way which is highly selective from the patterned relief layer. Aluminum (Al) is one example of a conductive and selectively removable material which can be removed by conventional aqueous basic developers when coated to a thickness of 100–200 A.

Figure 4:
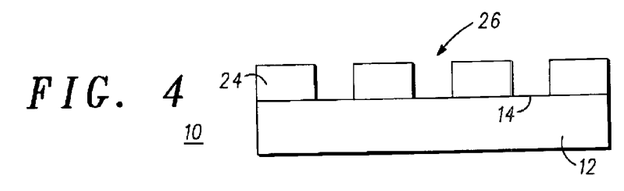

Illustrated in FIG. 3 is substrate 12, having formed thereon surface 14, patterning layer 16, and charge dissipation layer 20, formed on surface 18 of patterning layer 16. Subsequent to the baking of patterning layer 16, template layers 16 and 20 are exposed by standard optical or e-beam patterning techniques, thereby forming a patterned imageable relief structure 26 as illustrated in FIG. 4. It is anticipated by this disclosure that exposure of layers 16 and 20 can be accomplished utilizing e-beam radiation, x-ray radiation, deep-ultra violet radiation, ion beam radiation, or any other suitable radiation that provides for the exposure of patterning layer 16. Patterning layer 16 and charge dissipation layer 20 are radiated through to surface 14 of substrate 12. Next, patterning layer 16 and charge dissipation layer 20 are washed in a developer to remove any unexposed or non-radiated portions of patterning layer 16 and to remove remaining portions of charge dissipation layer 20, resulting in a remaining patterned imageable relief layer 24 as illustrated in FIG. 4. It should be understood that anticipated by this disclosure is the fabrication of template 10 using either positive processing or negative processing as described below.

Fabrication of template 10 in this manner to include charge dissipation layer 20 and patterned imageable relief layer 24 provides for patterning lines as small as 20 nm utilizing SFIL and as such enables SFIL to become a viable sub-30 nm lithographic technique. It should be understood that while the above negative patterning method is disclosed for fabricating template 10 in this particular embodiment, positive patterning to fabricate template 10 is additionally anticipated by this disclosure. It should be understood that in the vernacular of lithography, positive processing is said to occur when, within the imaging (resist) layer, material is removed in areas which have been exposed (irradiated) by the irradiating source. Negative processing is the opposite, and implies that within the resist layer, material is removed in unexposed areas. Removal of material in either case is typically done following irradiation, through use of a developing solution which is formulated to dissolve and remove either exposed or unexposed areas of resist. Resist materials themselves are formulated to react to irradiation by undergoing structural changes which either facilitate or inhibit dissolution in a developer.

Additionally it should be understood that during the fabrication of template 10, chemical amplification may be employed in the chemistry of the imageable materials to lower radiation requirements. More specifically, where chemical amplification is proposed, a second bake step is generally, but not necessarily, utilized subsequent to the irradiation of patterning layer 16 and charge dissipation layer 20. In addition, a descumming process may be employed, including a light plasma etch, after the relief structure is formed to remove any residual transparent dielectric material, and specifically, any remaining patterning layer 16, that remains in an area to be cleared.

FIG. 4 illustrates in cross-sectional view, a completed lithographic template 10 including substrate 12 having surface 14 and patterned imageable relief layer 24 overlying surface 14 of substrate 12. Upon completion, template 10 defines therein relief structure 26.

Figure 5:
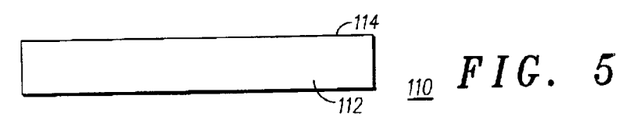

Referring now to FIGS. 5–9, illustrated are the steps in the process of fabricating a second embodiment of the lithographic template according to the present invention in which a separate contrast enhancement layer (discussed presently) is included, sandwiched between substrate 12 and patterning layer 16. More specifically, referring to FIG. 5, illustrated is a first step In the process of fabricating a lithographic template 110 according to the present invention. Illustrated is substrate 112, having a surface 114. Substrate 112 is disclosed as being comprised of a transparent or semi-transparent material, such as a quartz material, a polycarbonate material, a pyrex material, a calcium fluoride ($CaF_2$) material, a magnesium fluoride material ($MgF_2$), or any other similar type of material, that is transparent to light.

Figure 6:
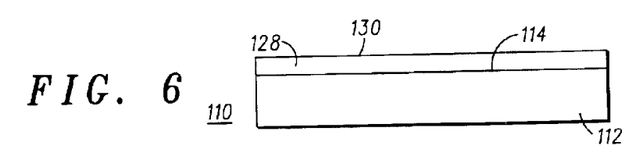

Referring now to FIG. 6, illustrated is substrate 112, having deposited thereon surface 114, a contrast enhancement layer 128. Contrast enhancement layer 128 is disclosed as being formed of a transparent or semi-transparent material such as chrome oxide (CrO), chrome nitride (CrN), titanium oxide (TiO), aluminum oxide($Al_2O_3$), or aluminum nitride (AlN), or combinations thereof. Contrast enhancement layer 128 provides for improved inspection capabilities due to the presence of different reflection properties, indexes of refraction, and/or atomic number between contrast enhancement layer 128 and the patterned imageable relief layer (discussed presently).

Figure 7:
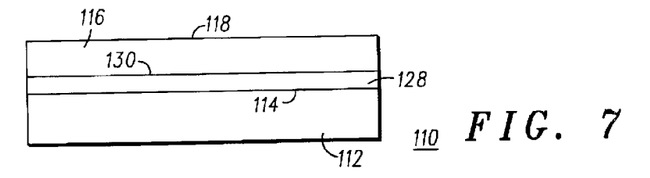

Referring now to FIG. 7, illustrated is substrate 112, having deposited thereon uppermost surface 114, contrast enhancement layer 128. Contrast enhancement layer 128, has deposited thereon an uppermost surface 130, a patterning layer 116. Patterning layer 116 is disclosed as generally having a thickness dependent upon the desired aspect ratio of the resulting patterning. Specifically, patterning layer 116 will need to have sufficient mechanical strength and durability to survive the stresses associated with template manufacturing and subsequent handling during the fabrication of the semiconductor devices with the completed lithographic template. Patterning layer 116 is therefore generally disclosed as having a thickness of between 10 and 5000 nm, and a preferred thickness of at least 50 nm. Pattering layer 116, having a surface 118, is formed on surface 130 of contrast enhancement layer 128 by spin coating, sputtering, vapor deposition, or the like.

Figure 8:
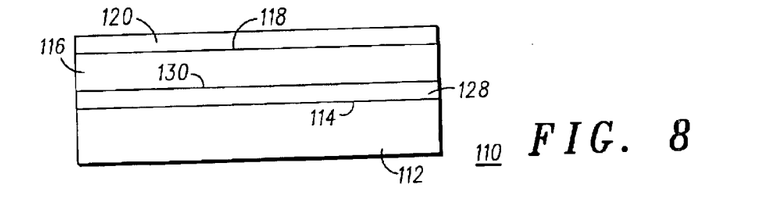

Patterning layer 116 in a preferred embodiment is disclosed as being formed of an imageable dielectric material. More specifically, patterning layer is disclosed as being formed of an imageable oxide, such as hydrogen silsesquioxane (HSQ), marketed by Dow Coming as FOX-15®. In addition, patterning layer 116 could be formed of alternative imageable dielectric materials, such as an imageable nitride, or an imageable oxynitride. During template fabrication, patterning layer 116 is formed on surface 130 of contrast enhancement layer 128 and then baked at a low temperature, such as approximately 200° C., to remove any solvents present Referring now to FIG. 8, illustrated is substrate 112, having formed thereon contrast enhancement layer 128 and patterning layer 116. Next, a charge dissipation layer 120 is formed on surface 118 of patterning layer 116. Charge dissipation layer 120 is disclosed as being formed of a conductive material characterized as dissipating the charge during template fabrication. More specifically, charge dissipation layer 120 is disclosed as being formed of aluminum (Al), copper (Cu), titanium (Ti), polyanaline, or any other conductive material that is selectively removable from patterning layer 116 and is suitable for dissipating charge. Charge dissipation layer 120 is formed to assist in the dissipation of charge during electron beam (e-beam) writing, or other radiation forms used to pattern the layers. Similar to the embodiment described with respect to FIGS. 1–4, charge dissipation layer 120 in this particular embodiment is formed of aluminum (Al) which is deposited on patterning layer 116.

Charge dissipation layer 120 is disclosed as having a minimal thickness dependent upon the charge conductivity of the material used. Charge dissipation layer 120 is therefore generally disclosed as having a thickness in a range of 1–1000 nm, and a preferred thickness of at least 5 nm. Charge dissipation layer 120 is formed on surface 118 of patterning layer 116 by spin coating, sputtering, vapor deposition, or the like.

Figure 9:
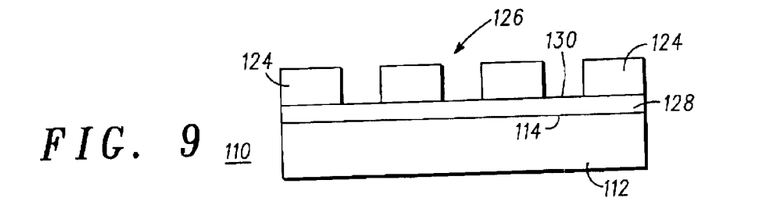

Illustrated in FIG. 9 is substrate 112, having formed thereon surface 114, contrast enhancement layer 128, and a patterned imageable relief layer 124. Subsequent to the baking of pattering layer 116, template layers 116 and 120 are patterned by standard optical or abeam patterning techniques, thereby forming patterned imageable relief layer 124. It is anticipated by this disclosure that patterning of layers 116 and 120 can be accomplished utilizing e-beam radiation, x-ray radiation, deep-ultra violet radiation, ion beam radiation, or any other suitable radiation that provides for the exposure of patterning layer 116. Patterning layer 116 and charge dissipation layer 120 are radiated through to surface 130 of contrast enhancement layer 128. Next, patterning layer 116 and charge dissipation layer 120 are washed in a developer to remove any non-exposed, or non-radiated, portions of patterning layer 116 and to remove remaining portions of charge dissipation layer 120, resulting in remaining patterned imageable relief layer 124 as illustrated in FIG. 9. Fabrication of template 110 in this manner to include charge dissipation layer 120 and patterned imageable relief layer 124, provides for patterning lines as small as 20 nm utilizing SFIL and as such enables SFIL to become a viable sub-30 nm lithographic technique. It should be understood that while the above negative patterning method is disclosed for fabrication template 110, positive patterning to fabricate template 110 is additionally anticipated by this disclosure. FIG. 9 illustrates in cross-sectional view, a completed lithographic template 110 including substrate 112 having surface 114, contrast enhancement layer 128, and patterned imageable relief layer 124 overlying surface 130 of contrast enhancement layer 128. Upon completion, template 110 defines therein relief structure 126.

During the fabrication of template 110, chemical amplification may be employed in the chemistry of the imageable materials to lower radiation requirements. More specifically, where chemical amplification is proposed, a second bake step is generally, but not necessarily, utilized subsequent to the irradiation of patterning layer 116 and charge dissipation layer 120. In addition, a descumming process may be employed, including a light plasma etch, to remove any undesired residual transparent dielectric material.

Figure 10:
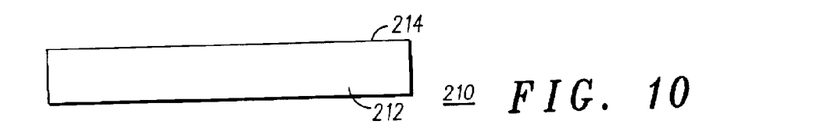

Referring now to FIGS. 10–13, illustrated are the steps in the process of fabricating a third embodiment of the lithographic template according to the present invention. More specifically, referring now to FIG. 10, illustrated is a first step in the process of fabricating a lithographic template 210 according to the present invention. Illustrated is substrate 212, having a surface 214. Substrate 212 is disclosed as being comprised of a transparent or semi-transparent material, such as a quartz material, a polycarbonate material, a pyrex material, a calcium fluoride ($CaF_2$) material, a magnesium fluoride material ($MgF_2$), or any other similar type of material, that is transparent or semi-transparent to light.

Figure 11:
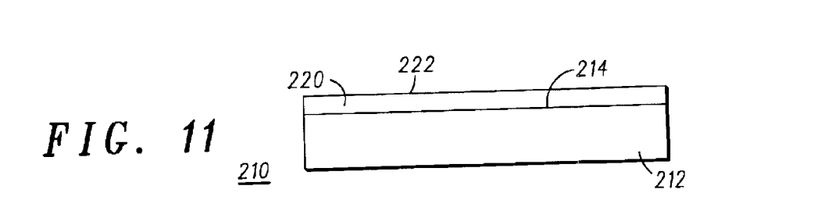

Referring now to FIG. 11, illustrated is substrate 212, having deposited thereon surface 214 and a charge dissipation layer 220. Charge dissipation layer 220 is disclosed as being formed of a transparent or semi-transparent conducting oxide. Examples of transparent or semi-transparent conducting oxides suitable for charge dissipation layer 220 include indium-tin-oxide (ITO), indium oxide, tin oxide, zinc oxide, cadmium oxide, copper aluminum oxide, copper gallium oxide, cadmium tin oxide, a transparent conducting material, a semi-transparent conducting material, or combinations thereof. Similar to charge dissipation layer 20 of FIGS. 1–4 and charge dissipation layer 120 of FIGS. 5–9, charge dissipation layer 220 is formed to assist in the dissipation of charge during electron beam (e-beam) writing, or other radiation forms used to pattern subsequent layers (discussed presently). In addition, charge dissipation layer 220 aids in the dissipation of charge during SEM-based template inspection.

Charge dissipation layer 220 is disclosed as having a thickness dependent upon the charge conductivity of the material used. In addition, charge dissipation layer 220 must have sufficient strength to survive the stresses associated with template manufacturing and subsequent handling during the fabrication of the semiconductor devices with the completed lithographic template. Charge dissipation layer 220 is therefore generally disclosed as having a thickness in a range of 1–1000 nm, and a preferred thickness of at least 50 nm. Charge dissipation layer 220 having a surface 222 is formed on surface 214 of substrate 212 by spin coating, sputtering, vapor deposition, or the like. In this particular embodiment, as illustrated in FIGS. 10–13, charge dissipation layer 220 is formed of ITO which is deposited on a quartz substrate 212. Charge dissipation layer 220 of this embodiment should be composed of a material which is not removed or etched during the processing of patterning such as during developing. This is because of the location of charge dissipation layer 220 is below the patterning layer (discussed presently) which is in contrast to other embodiments which call for this layer to be on top of the patterning layer. In general, a charge dissipation or contrast enhancing layer which is below the patterning layer must not be removed during template fabrication. When the charge dissipation layer is located on top of the patterning, it is generally desired that it be removed during fabrication.

Figure 12:
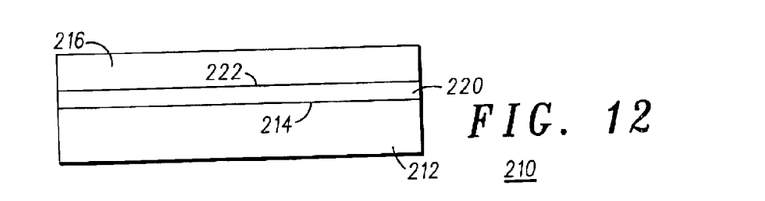

Referring now to FIG. 12, illustrated is substrate 212, having formed thereon charge dissipation layer 220. There is additionally formed on surface 222 of charge dissipation layer 220, a patterning layer 216. Patterning layer 216 is disclosed as generally having a thickness dependent upon the desired aspect ratio of the resulting patterning. Specifically, because this layer comprises the relief pattern of the template, patterning layer 216 will need to have sufficient mechanical strength and durability to survive the stresses associated with template manufacturing and subsequent handling during the fabrication of the semiconductor devices with the completed lithographic template. Patterning layer 216 is therefore generally disclosed as having a thickness of between 10 and 5000 nm, and a preferred thickness of at least 50 nm. Patterning layer 216 formed on surface 222 of charge dissipation layer 220 by spin coating, sputtering, vapor deposition, or the like.

Patterning layer 216 in a preferred embodiment is disclosed as being formed of an imageable dielectric material. More specifically, patterning layer 216 is disclosed as being formed of an imageable oxide, such as hydrogen silsesquioxane (HSQ), marketed by Dow Corning as FOX-15®. In addition, patterning layer 216 could be formed of alternative imageable dielectric materials, such as an imageable nitride, or an imageable oxynitride. During template fabrication, patterning layer 216 is formed on surface 222 of charge dissipation layer 220 and then baked at a low temperature, such as approximately 200° C., to remove any solvents present.

Figure 13:
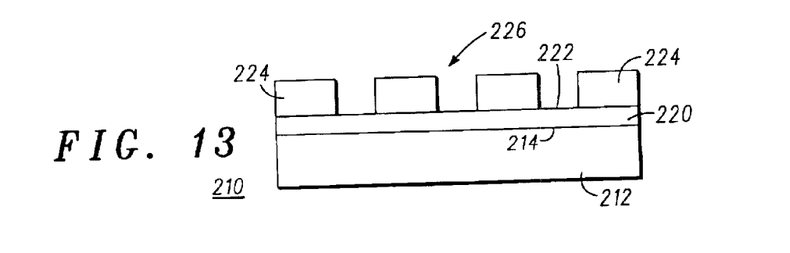

Illustrated in FIG. 13 is substrate 212, having formed thereon surface 214, charge dissipation layer 220 and a patterned imageable relief layer 224, formed on surface 222 of charge dissipation layer 220. Subsequent to the baking of patterning layer 216, patterning layer 216 is patterned by standard optical or abeam patterning techniques, thereby forming patterned imageable relief layer 224. It is anticipated by this disclosure that patterning of layer 216 can be accomplished utilizing e-beam radiation, x-ray radiation, deep-ultra violet light radiation, ion beam radiation, or any other suitable radiation that provides for the exposing of patterning layer 216. Patterning layer 216 is radiated through to surface 222 of charge dissipation layer 220. Next, patterning layer 216 is washed in a developer to remove any non-exposed portions resulting in a patterned imageable relief layer 224 as illustrated in FIG. 13. Fabrication of template 210 in this manner to include charge dissipation layer 220 and patterned imageable relief layer 224 provides for patterning lines as small as 20 nm utilizing SFIL and as such enables SFIL to become a viable sub-30 nm lithographic technique. It should be understood that while the above negative patterning method is disclosed for fabricating template 210 in the preferred embodiment, positive patterning to fabricate template 210 is additionally anticipated by this disclosure. Template 210 fabricated as disclosed herein provides for removal of residual patterning layer 216 which remains in an area to be cleared following the development process. This is done by employing a descumming process, including a light plasma etch, after the relief structure is formed to remove any residual transparent dielectric material, and specifically, any remaining patterning layer 216, that remains in an undesired area. Additionally, template 210 fabricated in this manner provides for enhanced inspectability, compatibility with current template repair techniques, resistance to aggressive cleans, amorphous/low surface roughness materials for desirable pattern transfer attributes, and improved template contrast due to the varying material layers. FIG. 13 illustrates in cross-sectional view, a completed lithographic template 210 including substrate 212 having surface 214, charge dissipation layer 220 overlying surface 214 of substrate 212, charge dissipation layer 220 having a surface 222, and patterned imageable relief layer 224 overlying surface 222 of charge dissipation layer 220. Upon completion, template 210 defines therein relief structure 226.

During the fabrication of template 210, chemical amplification may be employed in the chemical mechanism of the imageable materials to lower radiation requirements. More specifically, where chemical amplification is proposed, a second bake step is often but not necessarily utilized subsequent to the irradiation of patterning layer 216. In addition, a descumming process may be employed, including a light plasma etch, to remove any residual transparent dielectric material.

Anticipated by this disclosure is a fourth embodiment (not shown) of a lithographic template, similar to the embodiment illustrated in FIGS. 10–13, in which charge dissipation layer 220 further acts as a contrast enhancement layer, and includes contrast enhancement properties. The inclusion of contrast enhancement properties in charge dissipation layer 220 provides for improved inspection capabilities due to the presence of different reflection properties, indices of refraction, and/or atomic number between patterned layer 224 and charge dissipation layer 220.

Figure 14:
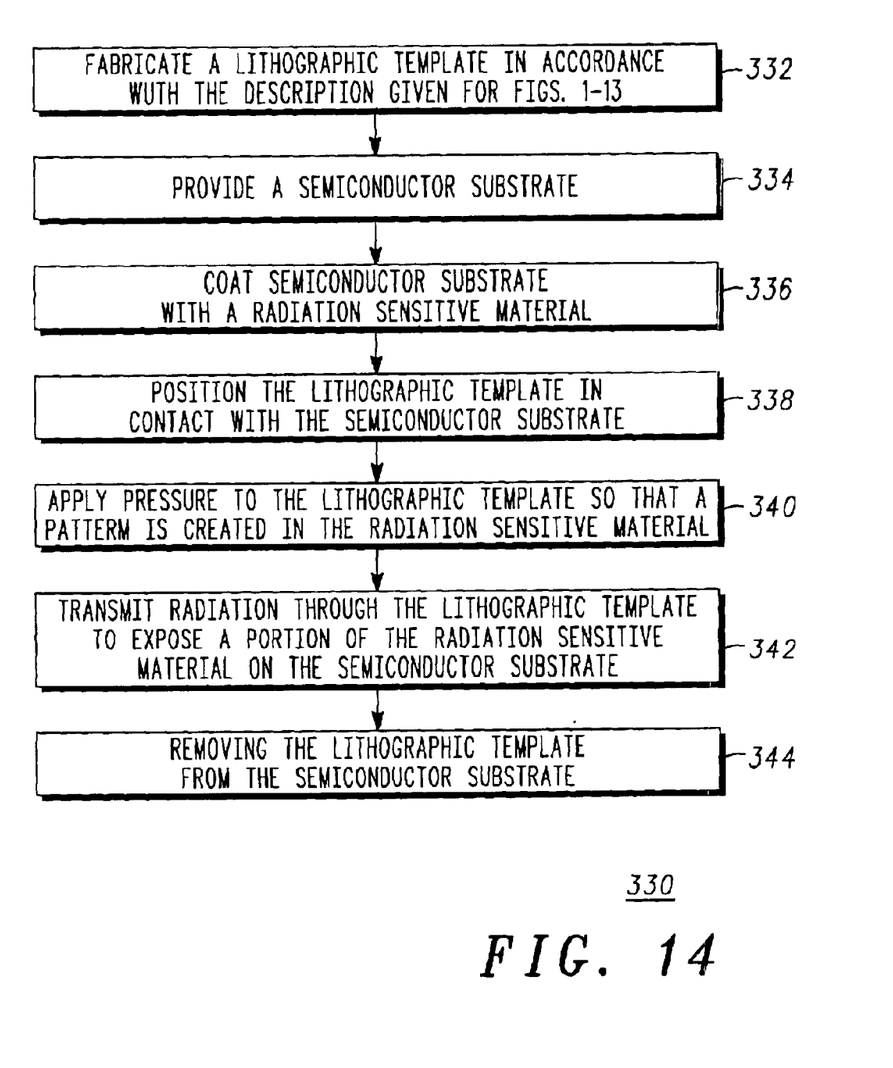
FIG. 14 is a simplified process flow diagram fabricating a semiconductor device with a lithographic template in accordance with the present invention.

Illustrated in FIG. 14 is a process flow diagram wherein a lithographic template, generally similar to template 10, 110, and 210 of FIGS. 1–13, fabricated in accordance with the present invention is used to fabricate a semiconductor device 330. Initially, a lithographic template is fabricated 332 in accordance with the description given for FIGS. 1–13. Next, a semiconductor substrate 334 is provided. Semiconductor substrate is then coated 336 with a radiation sensitive material, such as a photocurable organic layer or a photoresist layer. The semiconductor substrate may have overlying devices or device layer such as polysilicon, oxide, metal, etc., as well as trench and diffusion regions or the like. The radiation sensitive material layer coated semiconductor substrate is then placed adjacent 338 the lithographic template. A pressure is applied 340 to the template so that the radiation sensitive material layer flows into the relief images on the template. Radiation is then transmitted 342 through the lithographic template, including the substrate, the contrast enhancement layer and the charge dissipation layer if applicable, and the patterned layer, and imaged onto the radiation sensitive material layer coated semiconductor substrate to further define and expose a pattern in the radiation sensitive material layer. The template is thereafter removed 344 from the semiconductor device, thereby leaving a patterned organic layer which is then used as an image layer for subsequent processing. The photoresist layer can then be used as a mask, either in conjunction with ion implantation to form implanted regions in the semiconductor substrate, or can be used in conjunction with conventional wet or dry etches or depositions to transfer the pattern into the semiconductor substrate, or into device layers overlying the semiconductor substrate. It should be understood that although the template fabricated in accordance with the present invention is described in the preferred embodiment as being used to fabricate a semiconductor device, that anticipated is the use of a template, generally similar to template 10, 110, or 210 of FIGS. 4, 8, or 13, to form microelectronic devices, micro electro mechanical devices, optoelectronic devices, photonic devices, and microfluidic devices.

The foregoing description and illustrations contained herein demonstrate many of the advantages associated with the present invention. In particular, the present invention provides for improvement of etch uniformity of a template used in lithographic printing, with respect to both critical dimension and etch depth. In addition, the method of fabricating the template and template structure according to the present invention provide for a template in which inspection for sub-micron structures is achievable.

Thus it is apparent that there has been provided, in accordance with the invention, a lithographic template, and a method of its formation and use that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A method of forming a lithographic template comprising the steps of:
   providing a substrate, the substrate having an uppermost surface;
   providing an irradiation sensitive and directly patternable patterning layer supported by the substrate; and
   directly patterning the irradiation sensitive and directly patternable patterning layer with a radiation source thereby forming a a final template relief structure consisting of the irradiation sensitive and directly patternable patterning layer.

2. A method for forming a lithographic template as claimed in claim 1, wherein the step of providing a substrate is further characterized as providing a substrate of one of a semi-transparent material or a transparent material.

3. A method of forming a lithographic template as claimed in claim 2 further including the step of providing a charge dissipation layer adjacent the irradiation sensitive and directly patternable patterning layer, the irradiation sensitive and directly patternable patterning layer and the charge dissipation layer formed on the surface of the substrate.

4. A method of forming a lithographic template as claimed in claim 3 wherein the step of providing a charge dissipation layer adjacent the irradiation sensitive and directly patternable patterning layer includes forming the charge dissipation layer on an uppermost surface of the irradiation sensitive and directly patternable patterning layer, the irradiation sensitive and directly patternable patterning layer formed on the uppermost surface of the substrate.

5. A method of forming a lithographic template as claimed in claim 4 wherein the step of providing a charge dissipation layer includes forming the charge dissipation layer of a material chosen from the group consisting of: aluminum (Al), copper (Cu), polyanaline, and a charge dissipating conducting material.

6. A method of forming a lithographic template as claimed in claim 4 further including the step of forming a contrast enhancement layer between the substrate and the irradiation sensitive and directly patternable patterning layer.

7. A method of forming a lithographic template as claimed in claim 6 wherein the contrast enhancement layer is a material chosen from the group of chrome oxide (CrO), chrome nitride (CrN), titanium oxide (TiO), aluminum oxide ($Al_2O_3$), or aluminum nitride (AlN), or combinations thereof.

8. A method of forming a lithographic template as claimed in claim 3 wherein the step of providing a charge dissipation layer adjacent the irradiation sensitive and directly patternable patterning layer includes forming the charge dissipation layer between the substrate and the irradiation sensitive and directly patternable patterning layer.

9. A method of forming a lithographic template as claimed in claim 8 wherein the step of providing a charge dissipation layer includes forming a charge dissipation layer of a material chosen from the group consisting of: indium-tin-oxide (ITO), indium oxide, tin oxide, zinc oxide, cadmium oxide, copper aluminum oxide, copper gallium oxide, cadmium tin oxide, a transparent conducting material, a semi-transparent conducting material, and combinations thereof.

10. A method of forming a lithographic template as claimed in claim 9 wherein step of forming the charge dissipation layer between the substrate and the irradiation sensitive and directly patternable patterning layer includes forming the charge dissipation layer to include contrast enhancement properties.

11. A method of forming a lithographic template as claimed in claim 1 wherein the irradiation sensitive and directly patternable patterning layer is formed of an imageable transparent dielectric.

12. A method of forming a lithographic template as claimed in claim 11 wherein the imageable transparent dielectric is an imageable oxide.

13. A method of forming a lithographic template as claimed in claim 12 wherein the imageable oxide is hydrogen silsesquioxane (HSQ).

14. A method of forming a lithographic template as claimed in claim 11 wherein the imageable transparent dielectric is an imageable nitride.

15. A method of forming a lithographic template as claimed in claim 11 wherein the imageable transparent dielectric is an imageable oxynitride.

16. A method for forming the lithographic template as claimed in claim 11 wherein the step of patterning the irradiation sensitive and directly patternable patterning layer includes patterning with an electron beam source.

17. A lithographic template comprising;
a substrate having an uppermost surface; and
a irradiation sensitive and directly patternable patterning layer defining a relief structure supported by the uppermost surface of the substrate.

18. A method of forming a lithographic template as claimed in claim 17 wherein the substrate is formed as one of a transparent substrate or an opaque substrate.

19. A lithographic template as claimed in claim 18 wherein the transparent substrate is further characterized as one of a quartz material, a polycarbonate material, a calcium fluoride ($CaF_2$) material, a magnesium fluoride ($MgF_2$) material, or a pyrex material.

20. A lithographic template as claimed in claim 17 further including a charge dissipation layer formed between the substrate and the irradiation sensitive and directly patternable patterning layer.

21. A method of forming a lithographic template as claimed in claim 20 wherein the charge dissipation layer includes contrast enhancement properties.

22. A lithographic template as claimed in claim 20 wherein the charge dissipation layer is formed of a transparent conducting oxide.

23. A lithographic template as claimed in claim 22 wherein the charge dissipation layer is formed of a material chosen from the group consisting of: indium-tin-oxide (ITO), indium oxide, tin oxide, zinc oxide, cadmium oxide, copper aluminum oxide, copper gallium oxide, cadmium tin oxide, and combinations thereof.

24. A lithographic template as claimed in claim 17 further including a contrast enhancement layer formed between the substrate and the irradiation sensitive and directly patternable patterning layer.

25. A lithographic template as claimed in claim 17 wherein the directly patternable patterning layer is formed of an imageable transparent dielectric material.

26. A lithographic template as claimed in claim 25 wherein the imageable transparent dielectric material is an imageable oxide.

27. A lithographic template as claimed in claim 25 wherein the imageable oxide is hydrogen silsesquioxane (HSQ).

28. A lithographic template as claimed in claim 25 wherein the imageable transparent dielectric material is an imageable nitride.

29. A lithographic template as claimed in claim 25 wherein the imageable transparent dielectric material is an imageable oxynitride.

30. A method for making a device comprising the steps of:
providing a substrate;
coating the substrate with a material layer characterized as deformable in response to a pressure applied thereto;
fabricating a lithographic template, wherein the lithographic template comprises;
a substrate having an uppermost surface; and
a irradiation sensitive and directly patternable patterning layer defining a relief structure supported by the uppermost surface of the substrate;
positioning the lithographic template in contact with the material layer, the material layer being between the template and the substrate;
applying pressure to the template, the material layer thereby deforming into the relief pattern on the template; and
removing the template from the substrate.

31. A method for making a device as claimed in claim 30 wherein the material layer is a radiation sensitive material layer.

32. A method for making a device as claimed in claim 30 wherein the radiation sensitive material layer is further characterized as a photocurable material layer.

33. A method for making a device as claimed In claim 30 further including the step of transmitting radiation through the lithographic template to expose at least a portion of the radiation sensitive material layer on the substrate, thereby further affecting the pattern in the radiation sensitive material layer.

34. A method for making a device as claimed in claim 33 wherein the step of transmitting radiation through the lithographic template is further characterized as transmitting ultraviolet light through the lithographic template.

35. A method for making a device as claimed in claim 33 wherein the step of transmitting radiation through the lithographic template is further characterized as transmitting deep ultraviolet light through the lithographic template.

36. A method for making a device as claimed in claim 30 wherein the device is one of a semiconductor device, a microelectronic device, a micro electro mechanical device, a photonic, an optoelectronic, or a microfluidic device.

37. A method for forming a lithographic template as claimed in claim 1, wherein the step of directly patterning the irradiation sensitive and directly patternable patterning layer with a radiation source includes the step of applying a developer solution to the irradiation sensitive and directly patternable patterning layer subsequent to the application of radiation by the radiation source.

* * * * *